(12) United States Patent
Hsu et al.

(10) Patent No.: US 9,805,996 B2
(45) Date of Patent: Oct. 31, 2017

(54) SUBSTRATE STRUCTURE AND MANUFACTURING METHOD THEREOF

(71) Applicant: Phoenix Pioneer Technology Co., Ltd., Hsinchu County (TW)

(72) Inventors: Shih-Ping Hsu, Hsinchu County (TW); Che-Wei Hsu, Hsinchu County (TW); Chin-Ming Liu, Hsinchu County (TW); Chih-Kuai Yang, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 15/206,485

(22) Filed: Jul. 11, 2016

(65) Prior Publication Data

US 2017/0019995 A1    Jan. 19, 2017

(30) Foreign Application Priority Data

Jul. 15, 2015    (CN) .......................... 2015 1 0413983

(51) Int. Cl.
*H05K 1/00*        (2006.01)
*H01L 23/13*    (2006.01)
(Continued)

(52) U.S. Cl.
CPC .......... *H01L 23/13* (2013.01); *H01L 21/4828* (2013.01); *H01L 21/4846* (2013.01);
(Continued)

(58) Field of Classification Search
CPC .. H05K 1/00; H05K 1/02; H05K 1/03; H05K 1/11; H05K 1/14; H05K 1/18; H05K 3/00; H05K 3/02; H05K 3/07; H05K 3/10; H05K 3/30; H05K 3/46; H01L 21/02; H01L 21/44; H01L 21/48; H01L 21/56; H01L 21/78;
(Continued)

(56) References Cited

U.S. PATENT DOCUMENTS 6,828,224 B2 * 12/2004 Iijima ................. H01L 21/4857
                                                                438/622
8,258,055 B2    9/2012 Hwang et al.
(Continued)

FOREIGN PATENT DOCUMENTS

TW          201203482 A1    1/2012
TW          201248830 A1    12/2012

*Primary Examiner* — Xiaoliang Chen
(74) *Attorney, Agent, or Firm* — McClure, Qualey & Rodack, LLP

(57) ABSTRACT

A substrate structure and a manufacturing method thereof are provided. The substrate structure comprises a dielectric material layer, a conductive wiring layer, a metal core layer, and a conductive pillar layer. The conductive wiring layer is disposed on a surface of the dielectric material layer. The metal core layer having a metal part is disposed inside the dielectric material layer. The conductive pillar layer is disposed inside the dielectric material layer and between the metal core layer and the conductive wiring layer. The metal part has a first side and a second side opposite the first side. One of the first side and the second side is electrically connected to the conductive pillar layer. A width of the first side is different from a width of the second side.

4 Claims, 9 Drawing Sheets

(51) Int. Cl.
*H01L 23/485* (2006.01)
*H01L 23/538* (2006.01)
*H01L 23/498* (2006.01)
*H01L 21/48* (2006.01)
*H01L 23/00* (2006.01)
*H05K 1/18* (2006.01)
*H01L 21/56* (2006.01)

(52) U.S. Cl.
CPC ...... *H01L 23/485* (2013.01); *H01L 23/49861* (2013.01); *H01L 23/5389* (2013.01); *H01L 24/24* (2013.01); *H01L 24/82* (2013.01); *H01L 21/568* (2013.01); *H01L 2224/04105* (2013.01); *H01L 2224/12105* (2013.01); *H01L 2224/24175* (2013.01); *H05K 1/185* (2013.01); *H05K 2201/10674* (2013.01)

(58) Field of Classification Search
CPC ......... H01L 23/12; H01L 23/14; H01L 23/31; H01L 23/48
USPC ....... 174/262, 251, 252, 254, 255, 258, 260; 361/688, 719, 720, 728, 761, 763, 764, 361/784; 428/137, 209; 438/107, 126, 438/373, 622, 667; 455/83, 550.1, 553.1
See application file for complete search history.

(56) References Cited

U.S. PATENT DOCUMENTS

| | | | |
|---|---|---|---|
| 8,483,104 B1* | 7/2013 | Saji | H04B 1/525 370/276 |
| 8,536,957 B1* | 9/2013 | Nakamura | H04B 1/0057 333/126 |
| 8,841,765 B2 | 9/2014 | Haba et al. | |
| 8,890,628 B2* | 11/2014 | Nair | H01L 25/16 257/416 |
| 2003/0002260 A1* | 1/2003 | Hasebe | H01L 23/142 361/720 |
| 2004/0107569 A1* | 6/2004 | Guzek | H01L 23/142 29/846 |
| 2005/0211465 A1* | 9/2005 | Sunohara | H01L 23/5389 174/260 |
| 2005/0245001 A1* | 11/2005 | Hyvonen | H01L 23/5389 438/107 |
| 2005/0255303 A1* | 11/2005 | Sawatari | H01L 23/142 428/209 |
| 2006/0083895 A1* | 4/2006 | Ikeda | B32B 3/10 428/137 |
| 2006/0131176 A1* | 6/2006 | Hsu | C25D 5/022 205/125 |
| 2007/0263364 A1* | 11/2007 | Kawabe | H01L 23/49822 361/728 |
| 2009/0205852 A1* | 8/2009 | Chen | H05K 3/428 174/254 |
| 2009/0301766 A1* | 12/2009 | Park | H01L 23/3121 174/255 |
| 2009/0310323 A1* | 12/2009 | Baek | H01L 23/5389 361/784 |
| 2011/0147059 A1* | 6/2011 | Ma | H01L 23/49822 174/258 |
| 2011/0203839 A1* | 8/2011 | Iwamoto | H05K 3/4608 174/260 |
| 2011/0216513 A1* | 9/2011 | Lee | H05K 1/185 361/761 |
| 2012/0087097 A1* | 4/2012 | Hong | H05K 1/185 361/763 |
| 2012/0199386 A1* | 8/2012 | Adachi | H05K 3/445 174/258 |
| 2013/0003314 A1* | 1/2013 | Igarashi | H05K 3/4608 361/719 |
| 2013/0119553 A1* | 5/2013 | Jeong | H01L 23/5389 257/774 |
| 2013/0242493 A1 | 9/2013 | Shenoy et al. | |
| 2014/0041907 A1* | 2/2014 | Kim | H05K 1/0204 174/252 |
| 2014/0126156 A1* | 5/2014 | Naganuma | H05K 1/0206 361/719 |
| 2014/0133117 A1* | 5/2014 | Saji | H05K 1/0243 361/761 |
| 2014/0144692 A1* | 5/2014 | Hamada | H05K 1/0253 174/262 |
| 2014/0252522 A1* | 9/2014 | Miyazaki | H01L 27/14605 257/432 |
| 2014/0253794 A1* | 9/2014 | Miyazaki | H04N 5/2257 348/373 |
| 2014/0308906 A1* | 10/2014 | Saji | H04B 1/0458 455/83 |
| 2015/0014034 A1* | 1/2015 | Hwang | H05K 3/4697 174/260 |
| 2015/0021074 A1* | 1/2015 | Kim | H05K 1/0271 174/258 |
| 2015/0055309 A1* | 2/2015 | Bae | H01L 23/481 361/761 |
| 2015/0084194 A1* | 3/2015 | Molzer | H01L 23/481 257/741 |
| 2015/0119102 A1* | 4/2015 | Saji | H04B 1/38 455/550.1 |
| 2015/0119104 A1* | 4/2015 | Saji | H04B 1/40 455/553.1 |
| 2015/0257261 A1* | 9/2015 | Kitagawa | H05K 1/0298 361/688 |
| 2015/0257268 A1* | 9/2015 | Kitagawa | H05K 3/007 174/262 |
| 2015/0282328 A1* | 10/2015 | Hamada | H05K 1/0242 361/764 |

* cited by examiner

SUBSTRATE STRUCTURE AND MANUFACTURING METHOD THEREOF

This application claims the benefit of priority based on People's Republic of China Patent Application No 201510413983.6, filed on Jul. 15, 2015, the contents of which are incorporated herein by reference in their entirety.

CROSS-REFERENCES TO RELATED APPLICATIONS

Not applicable.

BACKGROUND OF THE INVENTION

Field of the Invention

This invention is regarding a substrate structure and a manufacturing method thereof. More precisely speaking, this invention is regarding a semiconductor substrate structure and a manufacturing method thereof.

Descriptions of the Related Art

In recent years, users seek electronic products with compact size, high performance and versatility. Electronics manufacturers must accommodate more components in a limited area of an integrated circuit (IC) to achieve high density and miniaturization. Thus, electronics manufacturers develop a new package of the IC for embedding components in a substrate to reduce the package size and the connecting path between the components and the substrate. In addition, electronics manufacturers increase a layout area of the IC by a build-up substrate.

In prior art, most high-end chips use flip-chip (FC) package for high-end needs. More specifically, a chip scale package (CSP) is currently used in an electronic product for example, smart, phone, tablet, laptop or mini digital camera which needs high-frequency and high speed operations and compact size. Also, a substrate of a package is towards the fine line spacing, high-density, thinning tendency, low-cost and high electric characteristics.

However, fiberglass is generally used in the thin substrate structure with high cost. Rigidity and heat dissipation of fiberglass is not as metal material, such that the substrate containing fiberglass is often prone to warpage. Laser drilling of the substrate containing fiberglass is more difficult, such that the holes drilled by laser are poor and unable to meet the requirement of fine line spacing. Also, it needs complex process and a long processing time to form a stacked structure with blind holes by laser drilling. Therefore, the substrate containing fiberglass does not have industrial advantages.

For this reason, electronics manufacturers use metal material in a substrate to improve defect structure of the substrate containing fiberglass. However, it is necessary to consider insulation between through holes of the layers in a stacked structure of the substrate containing metal material due to the conductivity of metal material. Thus, the complexity of the manufacturing process of the substrate containing metal material increases. In addition, laser drilling and mechanical drilling are simultaneously used to form blind holes and through holes in the same layer of the substrate containing metal material, such that the offset generated by registration errors is unable to racer the requirement of fine line spacing.

In view of this, it is important to provide a substrate structure having rigidity and heat dissipation and meeting the fine line spacing, high-density, thinning tendency, low-cost and high electric characteristics.

SUMMARY OF THE INVENTION

An objective of the present invention is to provide a substrate structure which comprises a dielectric material layer, a first conductive wiring layer, a second conductive wiring layer, a metal core layer, a first conductive pillar layer, and a second conductive pillar layer. The first conductive wiring layer and the second conductive wiring layer are respectively disposed on a first surface and a second surface of the dielectric material layer. The metal core layer is disposed inside the dielectric material layer, and has at least one metal part. The first conductive pillar layer is disposed inside the dielectric material layer and between the metal core layer and the first conductive wiring layer, and has at least one conductive pillar. The second conductive pillar layer is disposed inside the dielectric material layer and between the metal core layer and the second conductive wiring layer, and has at least one conductive pillar. The at least one metal part has a first side and a second side opposite the first side. The first side and the second side are electrically connected to the at least one conductive pillar of the first conductive pillar layer and the at least one conductive pillar of the second conductive pillar layer, respectively. A width of the first side is different from a width of the second side.

Another objective of the present invention is to provide a manufacturing method of a substrate structure. The manufacturing method comprising the steps of: providing a metal substrate; etching the metal substrate to form a metal core layer having a plurality of metal parts and at least one coupling part, wherein each of the metal parts has a first side and a second side opposite the first side, and the metal parts are partially coupled to each other by the at least one coupling part; forming a dielectric material layer on the metal parts and the at least one coupling part; etching the metal core layer to remove the at least one coupling part and cause a width of the first side to be different from a width of the second side; forming the dielectric material layer on the metal parts to cause the metal core layer to be coated with the dielectric material layer; exposing the first and second sides of one of the metal parts; forming a first conductive pillar layer on the first side of the exposed metal part; forming a second conductive pillar layer on the second side of the exposed metal pan; forming a first conductive wiring layer on a first surface of the dielectric material layer; and forming a second conductive wiring layer on a second surface of the dielectric material layer.

Further another objective of the present invention is to provide a substrate structure which comprises a dielectric material layer, at least one conductive wiring layer, a metal core layer, and at least one conductive pillar layer. The at least one conductive wiring layer is disposed on a surface of the dielectric material layer. The metal core layer is disposed inside the dielectric material layer, and has at least one metal part. The at least one conductive pillar layer is disposed on a surface of the dielectric material layer and between the metal core layer and the at least one conductive wiring layer. The at least one metal part has a first side and a second side opposite the first side. The first or second sides is electrically connected to the at least one conductive pillar layer. A width of the first side is different from a width of the second side.

According to the above description, the substrate structure and manufacturing method of the present invention use a substrate containing metal material instead of fiberglass. Meanwhile, a simple manufacturing process instead of forming blind holes and through holes by laser drilling and mechanical drilling is used to form a metal core layer, conductive pillar layer, and a conductive wiring layer. Accordingly, the substrate structure and manufacturing method of the present invention achieve the fine line spacing to narrow a size of a substrate, and increase the electrical property and signal stability to meet high electric characteristics with rigidity and neat dissipation. Therefore, the processing time and cost of the substrate structure will be significantly reduced.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

In the following description, this invention will be explained with reference to embodiments thereof. However, the description of these embodiments is only for purposes of illustration rather than limitation. It should be appreciated that in the following embodiments and attached drawings, elements unrelated to this invention are omitted from depictions; and dimensional relationships among individual elements in the attached drawings are illustrated only for ease of understanding, but not to limit the actual scale.

Figure 1:
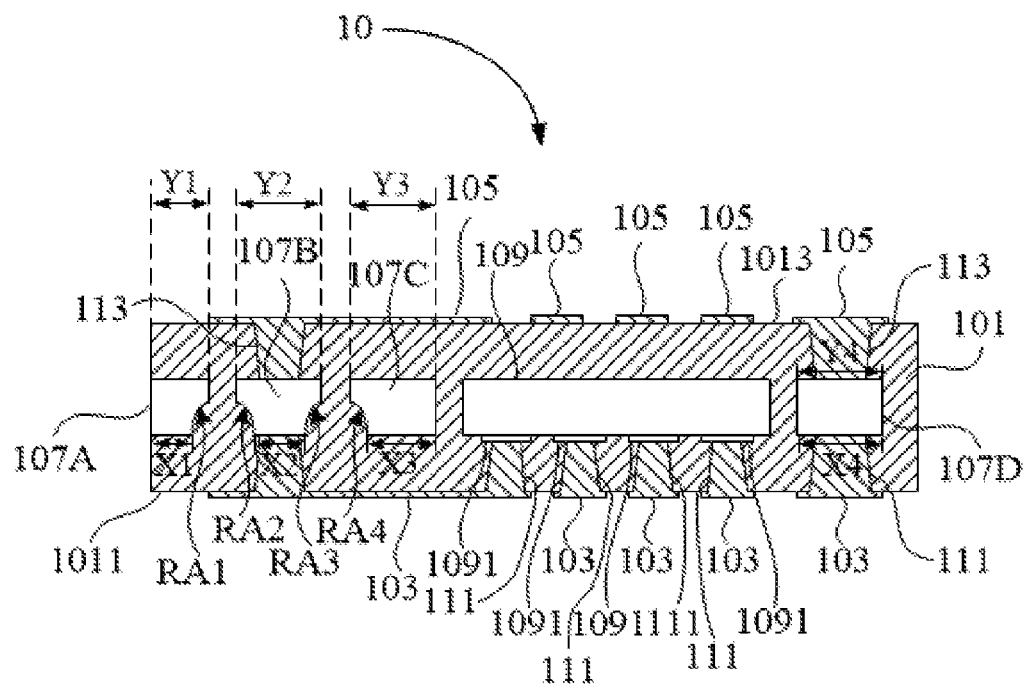
FIG. 1 is a schematic view of the first embodiment of a substrate structure of the present invention.

FIG. 1 depicts a substrate structure 10 of a first embodiment. The substrate structure 10 comprises a dielectric material layer 101, a first conductive wiring layer 103, a second conductive wiring layer 105, a metal core layer, a first conductive pillar layer 111, a second conductive pillar layer 113, and an internal component 109. The dielectric material layer 101 has a first surface 1011 and a second surface 1013. The metal core layer has four metal parts 107A, 107B, 107C, 107D. The first conductive pillar layer 111 and the second conductive pillar layer 113 have a plurality of conductive pillars. The internal component 109 has an electrode layer 1091.

The dielectric material layer 101 is a molding compound layer having novolac-based region, epoxy-based resin, silicone-based resin, or any molding compound with the same function and well known to those skilled in the art. It should be noted that the metal core layer is not limited to have four metal parts 107A, 107B, 107C, 107D in the embodiment. The meted core layer may have any amount of metal parts for different needs of the substrate structure 10.

The first conductive pillar layer 111 has six conductive pillars, and the second conductive pillar layer 113 has two conductive pillars. Similarly, it should be noted that the first conductive pillar layer 111 and the second conductive pillar layer 113 are respectively not limited to have six conductive pillars and two conductive pillars. The first conductive pillar layer 111 and the second conductive pillar layer 113 may have any amount of conductive pillars for different needs of the substrate structure 10.

The metal part 107A has a first side and a second side opposite the first side. The first side of the metal part 107A has a width X1, and the second side of the same has a width Y1. Similarly, the metal parts 107B, 107C, 107D individually have a first side and a second side opposite the first side. The first side of the metal part 107B has a width X2, and the second side of the same has a width Y2. The first side of the metal part 107C has a width X3, and the second side of the same has a width Y3. The first side of the metal part 107D has a width X4, and the second side of the same has a width Y4. The first sides of the metal parts 107B, 107D are electrically connected to the conductive pillars of the first conductive pillar layer 111. The second sides of the metal parts 107B, 107D are electrically connected to the conductive pillars of the second conductive pillar layer 113. In addition, each of the metal parts 107A, 107B, 107C and 107D has two sidewalls. At least one sidewall of the metal part has a curved surface with a chamfer angle so as to enhance the bonding strength between the dielectric material layer 101 with the metal core layer. In the embodiment, the metal part 107A has a curved surface RA1, the metal part 107B has two curved surfaces RA2 and RA3, and the metal part 107C has a curved surface RA4.

In the embodiment, the width Y1 of the second side of the metal part 107A is greater than the width X1 of the first side of the same. The width Y2 of the second side of the metal part 107B is greater than the width X1 of the first side of the same. The width Y3 of the second side of the metal part 107C is greater than the width X3 of the first side of the same. The width X4 of the first side and the width Y4 of the second side of the metal part 107D are approximately the same. In other words, the widths X1, X2, X3 of the first sides of the metal parts 107A, 107B, 107C are respectively different from the widths Y1, Y2, Y3 of the second sides of the metal parts 107A, 107B, 107C.

The first conductive pillar layer 111 is disposed inside the dielectric material layer 101 and between the metal core layer and the first conductive wiring layer 103. Meanwhile, the first conductive pillar layer 111 is electrically connected to the metal core layer and the first conductive wiring layer 103. Similarly, the second conductive pillar layer 113 is disposed inside the dielectric material layer 101 and between the metal core layer and the second conductive wiring layer 105. Meanwhile, the second conductive pillar layer 113 is electrically connected to the metal core layer and the second conductive wiring layer 105.

The metal parts 107A, 107B, 107C, 107D and the internal component 109 are disposed inside the dielectric material layer 101. The first conductive wiring layer 103 is disposed on the first surface 1011 of the dielectric material layer 101. The second conductive wiring layer 105 is disposed on the second surface 1013 of the dielectric material layer 101. Further, the metal parts 107A, 107B, 107C, 107B are disposed between the first and second conductive pillar layers 111, 113.

The electrode layer 1091 of the internal component 109 is electrically connected to the first conductive pillar layer 111 in the embodiment. It should be noted that the electrode layer 1091 of the internal component 109 may be electrically connected to the second conductive pillar layer 113 for different needs of the substrate structure 10.

Figure 2:
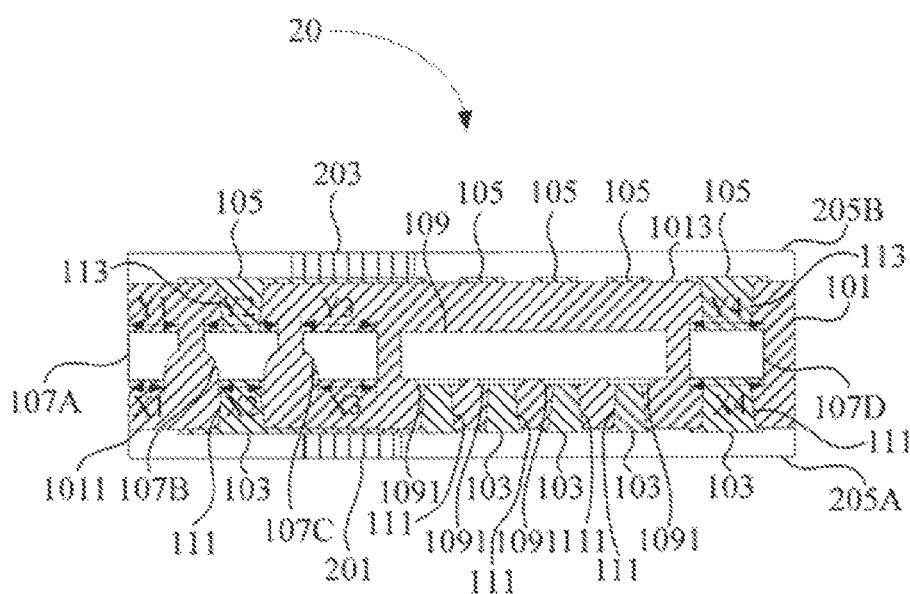
FIG. 2 is a schematic view of the second embodiment of a substrate structure of the present invention.

FIG. 2 depicts a substrate structure 20 of a second embodiment. The substrate structure 20 is approximately the same as the substrate structure 10 of the first embodiment. The substrate structure 20 further comprises a third conductive pillar layer 201, a fourth conductive pillar layer 203, and two epoxy molding compound layers 205A, 205B. The third conductive pillar layer 201 which is disposed in the epoxy molding compound layer 205A is partially electrically connected to the first conductive wiring layer 103. The fourth conductive pillar layer 203 which is disposed in the epoxy molding compound layer 205B is partially electrically connected to the second conductive wiring layer 105. The first conductive wiring layer 103 is coated with the epoxy molding compound layer 205A, and the second conductive wiring layer 105 is coated with the epoxy molding compound layer 205B.

The aforementioned substrate structures 10, 20 individually comprise two conductive wiring layers which are electrically connected to conductive pillars of a conductive pillar layer. It should be noted that the substrate structures 10, 20 may individually comprise one conductive wiring layer which is electrically connected to conductive pillars of a conductive pillar layer for different needs. The amount of conductive wiring layers of the substrate structures 10, 20 will be readily appreciated by those of ordinary skill in the art based on the explanation of the aforementioned description and, thus, will not be further described herein.

Figure 3:
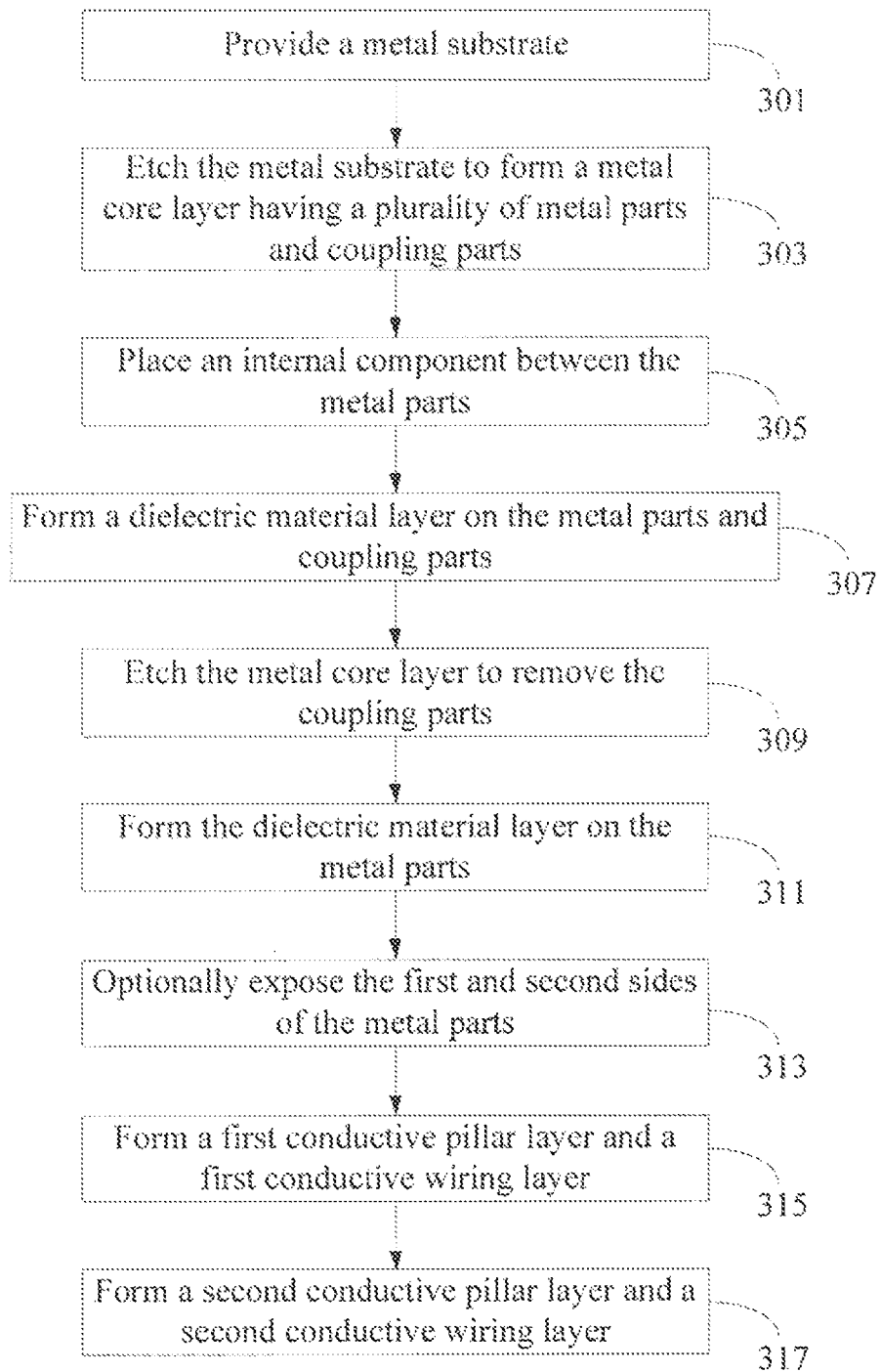
FIG. 3 is a flow chart of the third embodiment of a manufacturing method manufacturing a substrate structure of the present invention.

As shown in FIG. 3, a third embodiment of the present invention is a manufacturing method of a substrate structure. The manufacturing method is adapted for manufacturing substrate structures 10 described in the first embodiment. The manufacturing method of the third embodiment will be illustrated via FIG. 3 and FIG. 4A to FIG. 4I.

Figure 4A:
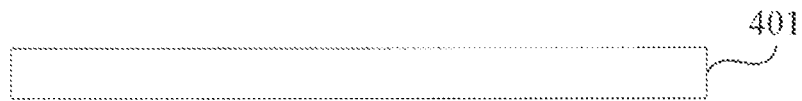
FIGS. 4A-4I are schematic views of the third embodiment of the manufacturing method manufacturing the substrate structure of the present invention.
Figure 4B:
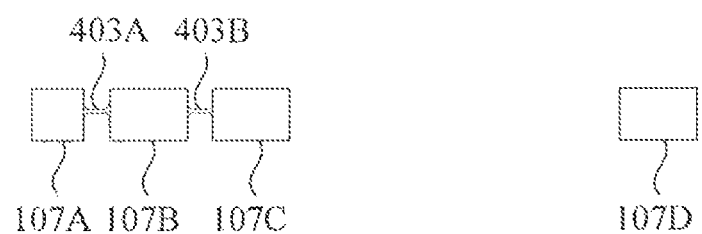

The manufacturing method comprises the following steps. Initially, step 301 is executed to provide a metal substrate 401, as shown in FIG. 4A. The metal substrate 401 is made of aluminum, copper, stainless steel, or a combination of the aforesaid materials. Step 303 is executed to etch the metal substrate 401 to form a metal core layer, as shown in FIG. 4B. The metal core layer has four metal parts 107A, 107B, 107C, 107D and two coupling parts 403A, 403B. Each of the metal parts 107A, 107B, 107C, 107D has a first side and a second side opposite the first side. The metal parts 107A, 107B are partially coupled to each other by the coupling part 403A. The metal parts 107B, 107C are partially coupled to each other by the coupling part 403B.

Figure 4C:
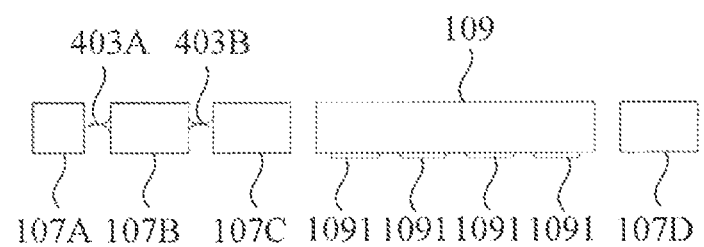
Figure 4D:
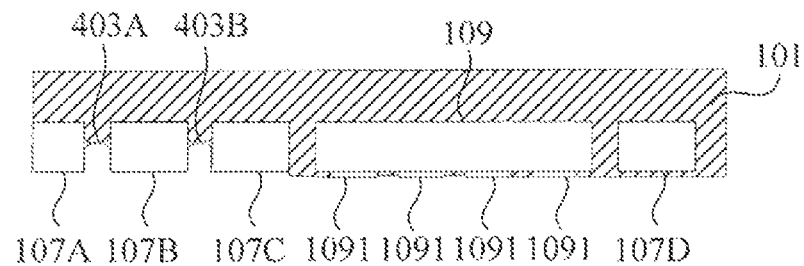

Step 305 is executed to place an internal component 109 between the metal pans 107C, 107D, as shown in FIG. 4C. The internal component 109 has an electrode layer 1091. Step 307 is executed to form a dielectric material layer 101 on the metal parts 107A, 107B, 107C, 107D and coupling parts 403A, 403B, as shown in FIG. 4D.

Figure 4E:
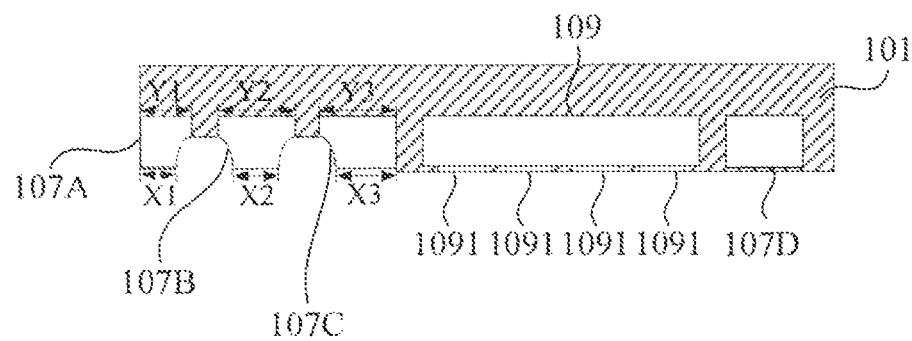

Step 309 is executed to etch the metal core layer to remove the coupling parts 403A, 403B and cause a width of the first side of each of metal parts 107A, 107B, 107C to be different from a width of the second side of each of metal parts 107A, 107B, 107C, as shown in FIG. 4E. More specifically, the widths X1, X2, X3 of the first sides of the metal parts 107A, 107B, 107C are respectively different from the widths Y1, Y2, Y3 of the second sides of the metal parts 107A, 107B, 107C.

Figure 4F:
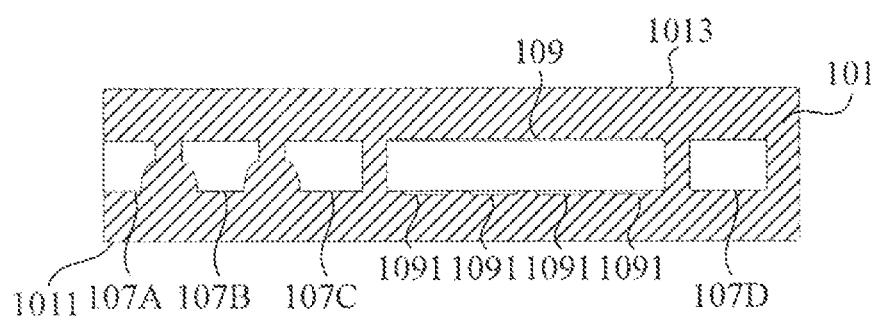
Figure 4G:
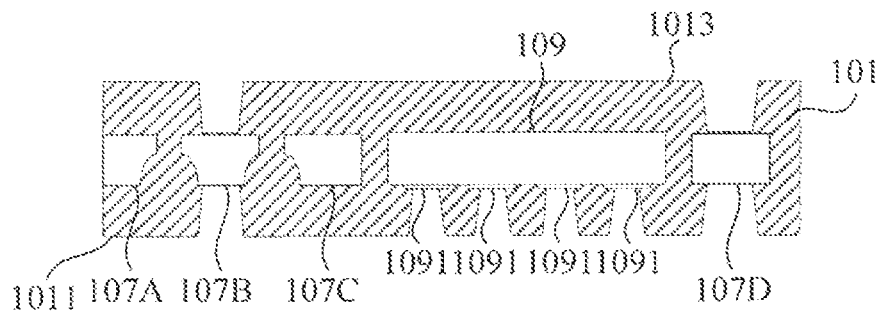

Step 311 is executed to form the dielectric material layer 101 on the metal parts 107A, 107B, 107C, 107D to cause the metal parts 107A, 107B, 107C, 107D to be coated with the dielectric material layer 101, as shown in FIG. 4F. Step 313 is executed to expose the electrode layer 1091 and optionally expose the first and second sides of the metal parts 107A, 107B, 107C, 107D, as shown in FIG. 4G. More specifically, the Step 313 is executed to expose the first and second sides of the metal parts 107B, 107D.

Figure 4H:
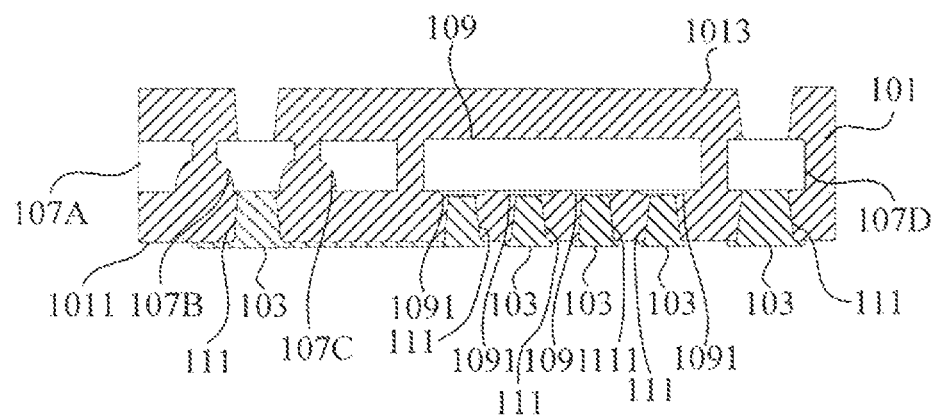

Step 315 is executed to form a first conductive pillar layer 111 on the first sides of the exposed metal parts 107B, 107D, and form a first conductive wiring layer 103 on a first surface 1011 of the dielectric material layer 101, as shown in FIG. 4H. More specifically, the first conductive pillar layer 111 is formed on the first side of one of the metal parts 107A, 107B, 107C, 107D.

Figure 4I:
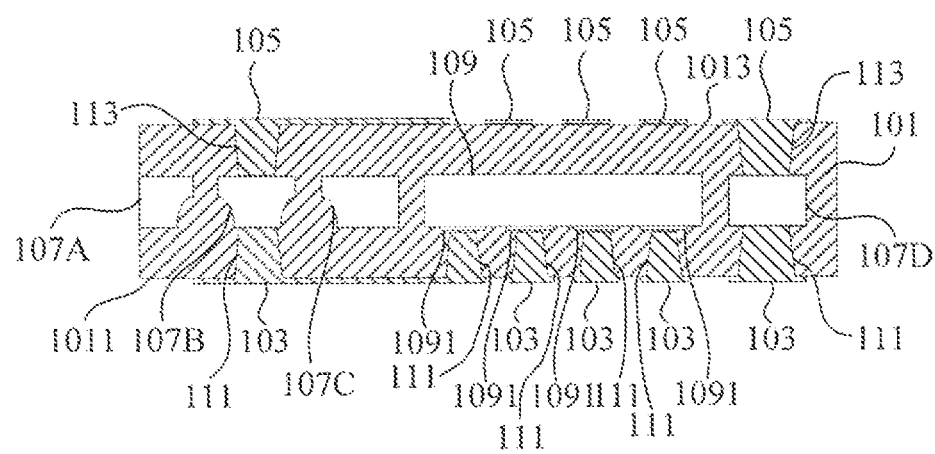

Finally, step 317 is executed to form a second conductive pillar layer 113 on the second sides of the exposed metal parts 107B, 107D, and form a second conductive wiring layer 105 on a second surface 1013 of the dielectric material layer 101, as shown in FIG. 4I. More specifically, the second conductive pillar layer 113 is formed on the second side of one of the metal parts 107A, 107B, 107D.

Figure 5:
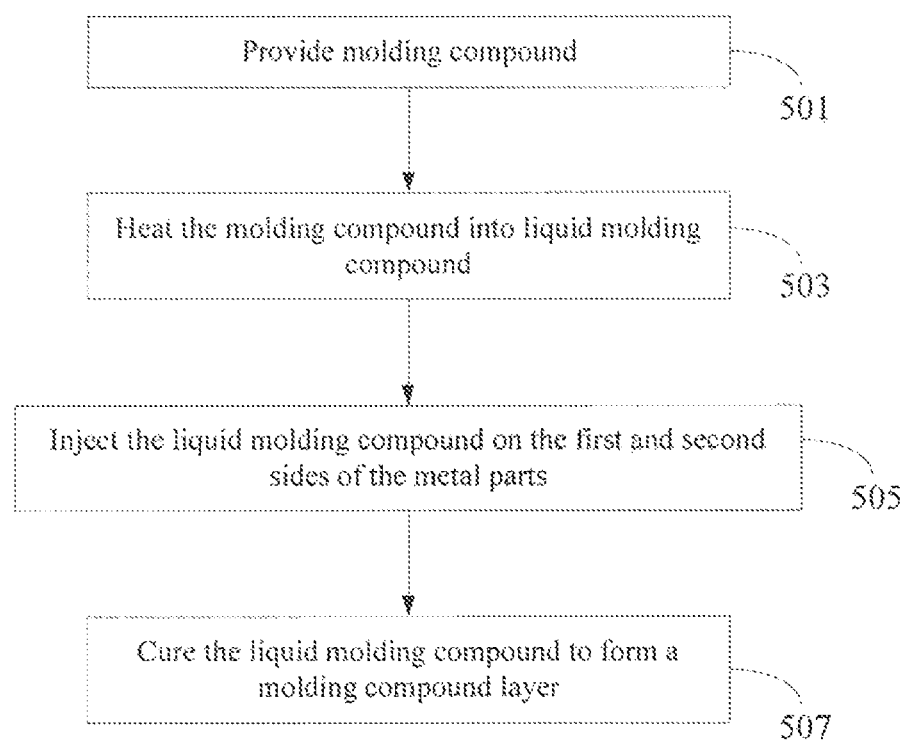
FIG. 5 is a flow chart of forming a dielectric material layer.

As shown in FIG. 5, the steps 307, 311 of forming the dielectric material layer 101 on the metal parts 107A, 107B, 107C, 107D further comprise the following steps. Step 501 is executed to provide molding compound. The molding compound is novolac-based resin, epoxy-based resin, silicone-based resin, or any molding compound with the same function and well known to those skilled in the art. Step 503 is executed to heat the molding compound into liquid molding compound. Step 505 is executed to inject the liquid molding compound on the first and second sides of the metal parts 107A, 107B, 107C, 107D to cause the metal parts 107A, 107B, 107C, 107D of the metal core layer to be coated with the liquid molding compound. Finally, Step 507 is executed to care the liquid molding compound to form a molding compound layer. In other words, the molding compound layer is the aforementioned dielectric material layer 101.

Figure 6:
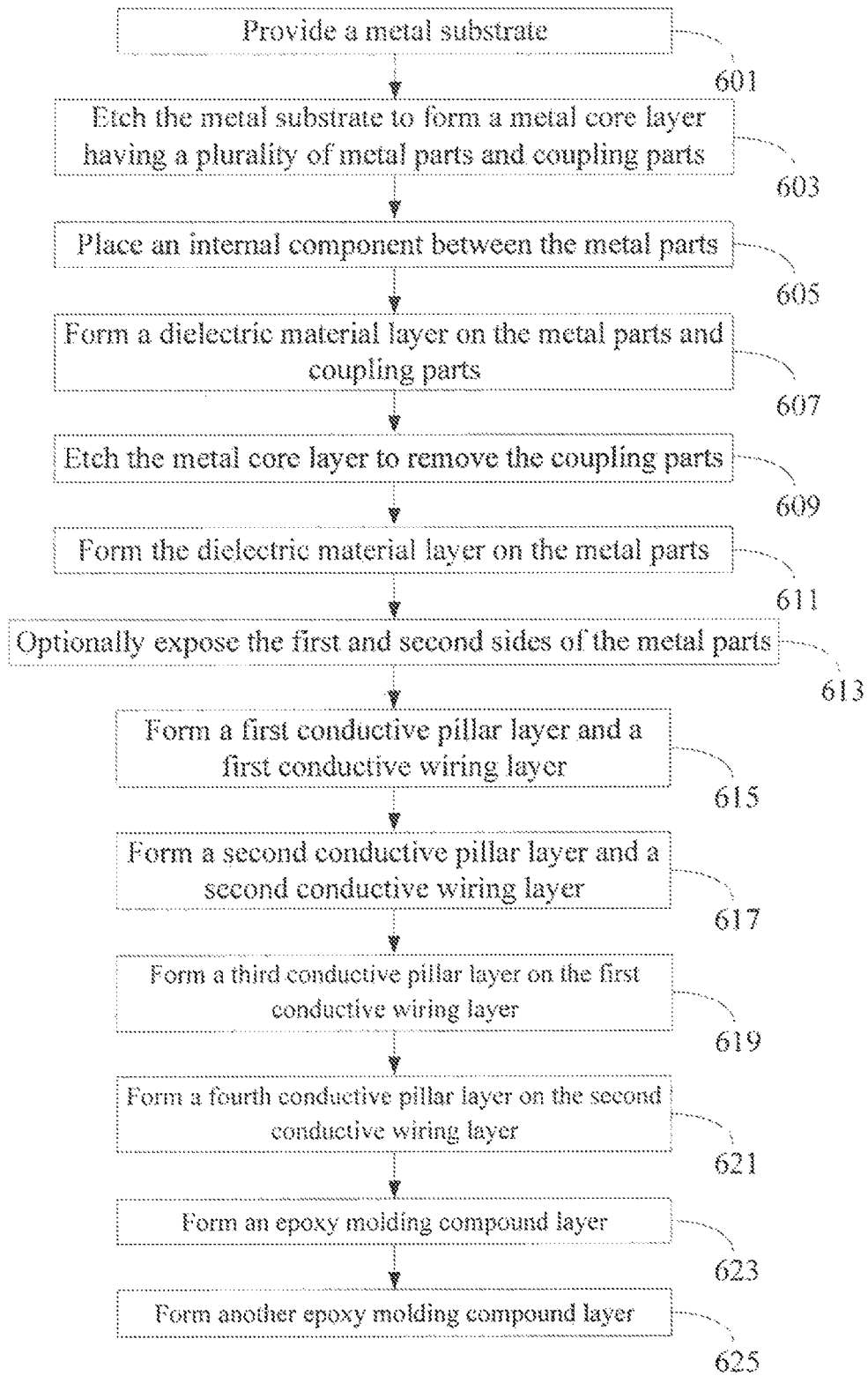
FIG. 6 is a flow chart of the fourth embodiment of a manufacturing method manufacturing a substrate structure of the present invention.

As shown in FIG. 6, a fourth embodiment of the present invention is a manufacturing method of a substrate structure. The manufacturing method is adapted for manufacturing substrate structures 20 described in the second embodiment. The step 601 to step 617 of the fourth embodiment are the same as the step 301 to step 317 of the third embodiment. The subsequent steps of the manufacturing method of the fourth embodiment will be illustrated via FIG. 6 and FIG. 7A to FIG. 7D.

Figure 7A:
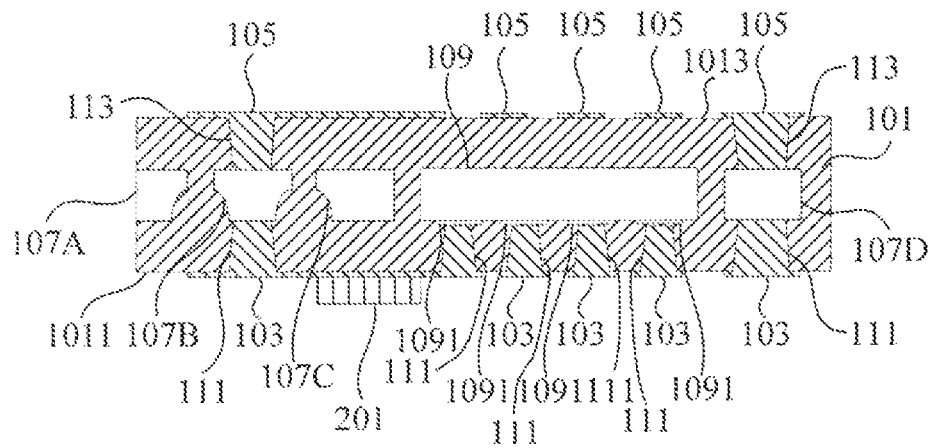
FIGS. 7A-7D are schematic views of the fourth embodiment of the manufacturing method manufacturing the substrate structure of the present invention.
Figure 7B:
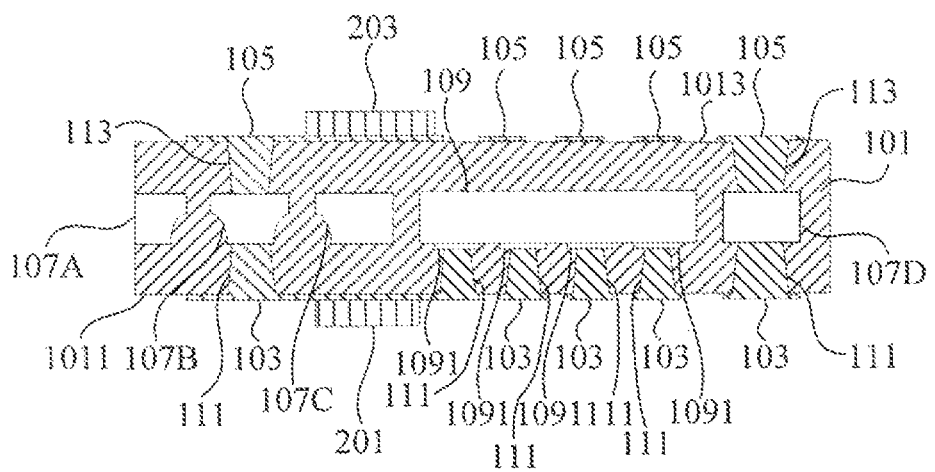

Step 619 is executed to form a third conductive pillar layer 201 on the first conductive wiring layer 103, as shown in FIG. 7A. The third conductive pillar layer 201 is partially electrically connected to the first conductive wiring layer 103. Step 621 is executed to form a fourth conductive pillar layer 203 on the second conductive wiring layer 105, as shown in FIG. 7B. Similarly, the fourth conductive pillar layer 203 is partially electrically connected to the second conductive wiring layer 105.

Figure 7C:
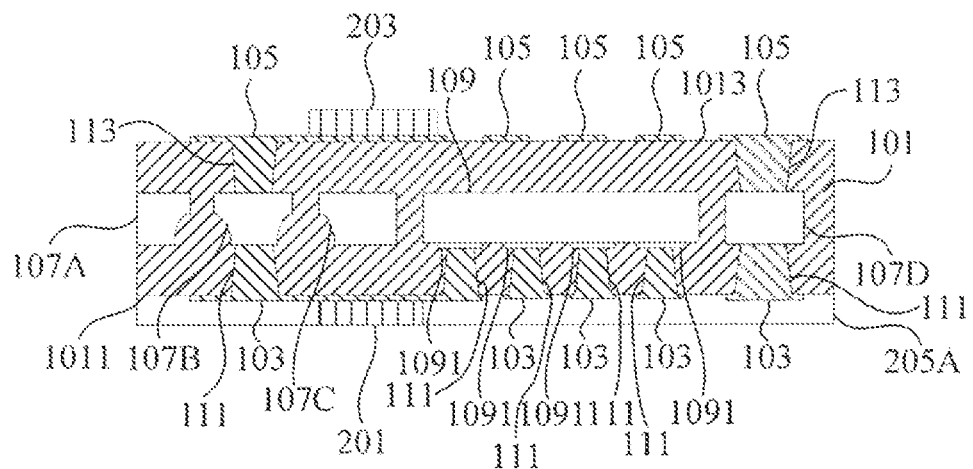
Figure 7D:
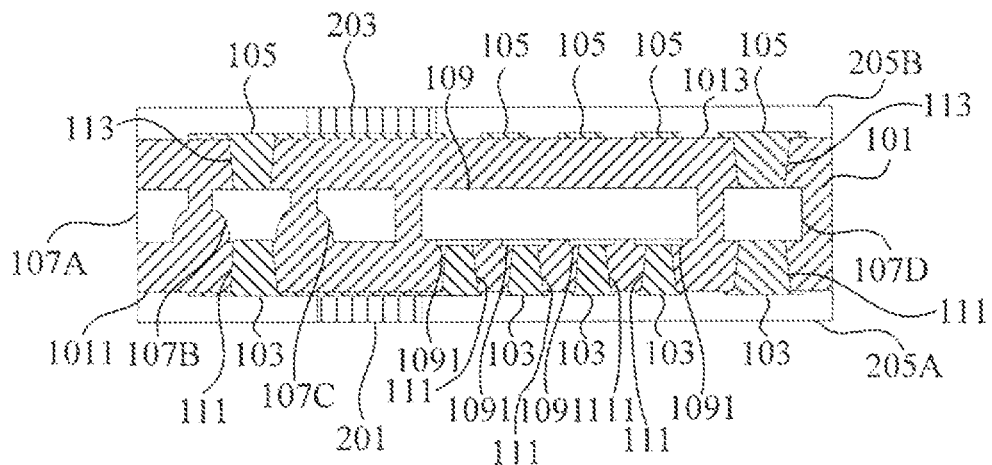

Step 623 is executed to form an epoxy molding compound layer 205A, as shown in FIG. 7C. The first conductive wiring layer 103 is coated with the epoxy molding compound layer 205A. Finally, Step 625 is executed to form an epoxy molding compound layer 205B, as shown in FIG. 7D. Similarly, the second conductive wiring layer 105 is coated with the epoxy molding compound layer 205B.

According to the above description, the substrate structure and manufacturing method of the present invention use a substrate containing metal material instead of fiberglass. Meanwhile, a simple manufacturing process instead of forming blind holes and through holes by laser drilling and mechanical drilling is used to form a metal core layer, conductive pillar layer, and a conductive wiring layer. Accordingly, the substrate structure and manufacturing method of the present invention achieve the fine line spacing to narrow a size of a substrate, and increase the electrical property and signal stability to meet high electric characteristics with rigidity and heat dissipation. Therefore, the processing time and cost of the substrate structure will be significantly reduced.

The above embodiments merely give the detailed technical contents of the present invention and inventive features thereof, and are not to limit the covered range of the present invention. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A substrate structure, comprising:
   a dielectric material layer;
   a first conductive wiring layer disposed on a first surface of the dielectric material layer;
   a second conductive wiring layer disposed on a second surface of the dielectric material layer;
   a metal core layer, disposed inside the dielectric material layer, having at least one metal part, which has two sidewalls, and at least one of the sidewalls has a curved surface with a chamfer angle;
   a first conductive pillar layer, disposed inside the dielectric material layer and between the metal core layer and the first conductive wiring layer, having at least one conductive pillar; and
   a second conductive pillar layer, disposed inside the dielectric material layer and between the metal core layer and the second conductive wiring layer, having at least one conductive pillar,
   wherein the at least one metal part has a first side and a second side opposite the first side, the first side is electrically connected to the at least one conductive pillar of the first conductive pillar layer, the second side is electrically connected to the at least one conductive pillar of the second conductive pillar layer, and a width of the first side is different from a width of the second side.

2. The substrate structure as claimed in claim 1, further comprising an internal component disposed inside the dielectric material layer, wherein the internal component has an electrode layer electrically connected to one of the first and second conductive pillar layers.

3. The substrate structure as claimed in claim 1, wherein the width of the second side is greater than the width of the first side.

4. The substrate structure as claimed in claim 1, wherein the dielectric material layer is a molding compound layer having one of novolac-based resin, epoxy-based resin, and silicone-based resin.

* * * * *